US00RE36203E

United States Patent [19]

Matsui

[11] E Patent Number: Re. 36,203

[45] Reissued Date of Patent: Apr. 27, 1999

[54] SEMICONDUCTOR MEMORY CIRCUIT

[75] Inventor: Yoshinori Matsui, Tokyo, Japan

[73] Assignee: NEC Corporation, Tokyo, Japan

[21] Appl. No.: 08/916,280

[22] Filed: Aug. 22, 1997

Related U.S. Patent Documents

Reissue of:

[64] Patent No.: 5,444,305
Issued: Aug. 22, 1995
Appl. No.: 08/084,017
Filed: Jun. 30, 1993

[30] Foreign Application Priority Data

Jun. 30, 1992 [JP] Japan ..... 4-172229

[51] Int. Cl.[6] ..... G11C 7/02

[52] U.S. Cl. ..... 365/207; 365/230.03; 365/230.04; 365/63

[58] Field of Search ..... 365/207, 203.03, 365/230.04, 189.01, 63

[56] References Cited

U.S. PATENT DOCUMENTS

| | | | |
|---|---|---|---|
| 4,807,194 | 2/1989 | Yamada et al. | 355/207 |
| 5,243,574 | 9/1993 | Ikeda | 365/207 |
| 5,644,525 | 7/1997 | Takashima et al. | 365/63 X |

FOREIGN PATENT DOCUMENTS

| | | |
|---|---|---|
| 0068645 | 1/1983 | European Pat. Off. . |
| 0401792 | 12/1990 | European Pat. Off. . |

*Primary Examiner*—Huan Hoang
*Attorney, Agent, or Firm*—Sughrue, Mion, Zinn, Macpeak & Seas, PLLC

[57] ABSTRACT

This semiconductor circuit includes a plurality of memory cell arrays arranged mutually adjacent in one direction, a plurality of first selection/sense amplifier circuits provided in the respective regions between mutually adjacent pairs of these memory cell arrays and make access to one of alternately defined odd-numbered or even-numbered memory cell trains in the order of arrangement, two units of second selection/sense amplifier circuits arranged on the outside of the memory cell arrays on both ends of the arrangement of the plurality of memory cell arrays and make access to one of the designated odd-numbered or even-numbered memory cell trains of the memory cell arrays on both ends, a plurality of data buses corresponding to the respective bits of data transferred in bit parallel between an external circuit, and a plurality of input and output switching circuits arranged and connected in one-to-one correspondence to the respective first and second selection/sense amplifier circuits connected to the plurality of data buses so as to have an equal number of memory cell trains capable of transferring data with these data buses, and a plurality of input and output switching circuits which transfer data with the first and the second selection/sense amplifier circuits in one-to-one correspondence.

20 Claims, 4 Drawing Sheets

SEMICONDUCTOR MEMORY CIRCUIT

Matter enclosed in heavy brackets [ ] appears in the original patent but forms no part of this reissue specification; matter printed in italics indicates the additions made by reissue.

*This application is a reissue 08/084,017, filed Jun. 30, 1993, now U.S. Pat. No. 5,444,305.*

BACKGROUND OF THE INVENTION

1. Field of the Invention

This invention relates to a semiconductor memory circuit, and more particularly to a semiconductor memory circuit which includes shared sense amplifiers and is adapted for multibit parallel input and output configuration and for increasing the capacity.

2. Description of the Prior Art

In semiconductor memory circuit, the folded bit line structure in which a bit line for giving a reference potential to a sense amplifier (referred to as bit line for reference potential hereinafter) and a bit line for reading out data of a memory cell (referred to as bit line for read hereinafter) are arranged on one side of the sense amplifier, gives less induced noise to the bit line compared with the open bit line structure which the bit line for reference potential and the bit line for read are arranged on the mutually opposite sides of the sense amplifier, so that it is currently in widespread use for semiconductor memory circuits.

Moreover, since in a semiconductor memory circuit such as a dynamic RAM (referred to as DRAM hereinafter) the ratio of the capacity of the memory cell capacitor (referred to as capacity of memory capacitor hereinafter) to the parasitic capacity of the bit line (referred to as capacity of bit line hereinafter) is related directly to the read voltage generated in the bit line, this ratio is an important parameter for the design of DRAM. The capacity of bit line is determined by the number, the size, and the structure of memory cells connected to the bit line, and the structure, size, material, or the like of the bit line itself. Accompanying the advancement of the generation of semiconductor memory circuits and the increase of the memory capacity, geometrical refinement or the memory cell and the bit line is advanced and the capacity of bit line is decreased. On the other hand, it brings about a decrease of the capacity of memory capacitor and an increase of the induced noise, and the number of the memory cells connected to one bit line has not been changed since it was increased from 64 bits to 128 bits for 256 kbit DRAM, even for the advances of the memory capacity of 1M bits, 4M bits, and 16M bits. Various kinds of split bit line modes have been proposed in order to keep the number of memory cells connected to one bit line constant, in the midst of the alternation of generation of DRAM as mentioned above, under the condition of limited chip size. Among them, the multisplit bit line shared sense amplifier mode (referred to as shared sense amplifier mode hereinafter) is being adopted most widely for the reasons is that it is possible to realize a reduction of power consumption and an improvement of operating speed, and is most advantageous from the viewpoint of chip size (see for example, 16Mbit DRAM μPD4216400 made by NEC Corporation which is the assigned of this application).

Next, an example of semiconductor-memory circuit of the shared sense amplifier mode will be described.

This semiconductor memory circuit comprises a plurality of memory cell arrays each including a plurality of memory cell trains connected respectively to bit line pairs of folded bit line mode, and are arranged in the direction in which each of these memory cell train extends while keeping the mutual correspondence relation among these memory cell trains, a plurality of first selection/sense amplifier circuits each including first selection means which is arranged in every interarray regions between the pair of mutually adjacent memory cell arrays and selects for each member of the respective pairs either of an odd-numbered train or an even-numbered train of the plurality of memory cell trains of the memory cell arrays on both sides of the interarray region, a plurality of sense amplifiers which amplify the respective read data of the memory cell trains selected by the first selection means in one-to-one basis, and second selection means which selects one of the plurality of sense amplifiers and one of the memory cell trains selected by the first selection means and connect them to the corresponding data input and output lines, and transmits one of the amplified read data of an odd-numbered or an even-numbered memory cell train of the selected memory cell array on one side to the corresponding data input and output lines and supplies write data transmitted to the corresponding data input and output lines to a selected memory cell train of a selected memory cell array, two units of second selection/sense amplifier circuits each including a plurality of sense amplifiers arranged on the outside of the respective memory cell arrays at both ends of the disposition of the plurality of memory cell arrays and amplify in one-to-one basis read data of memory cell trains set differently from those of the first selection/sense amplifier circuits corresponding to the outermost memory cell arrays and selection means which selects one of the plurality of the sense amplifiers and one of the set memory cell trains of the outermost memory cell array and connects them to corresponding data input and output lines, and transmit amplified read data from the set memory cell trains of the outermost memory cell arrays to corresponding data input and output lines and supply write data transmitted to the corresponding data input and output lines to selected memory cell trains of the outermost memory cell arrays, a plurality of data buses corresponding to the respective bits of data which is transferred in bit parallel mode between an external circuit, and a plurality of input and output switching circuits which transmit the respective read data from the memory cell arrays one by one to the corresponding data buses via the first and the second selection/sense amplifier circuits by sequentially assigning equal number of memory cell arrays in the order of arrangement to the plurality of data buses, respectively, and apply write data transmitted to these data buses from the external circuit to respective selected memory cell trains of the corresponding memory cell arrays.

If it is assumed in this semiconductor memory circuit that, for example, the number of the memory cell arrays is eight, the number of the data buses is four, and the data transfer between the external circuit is carried out in four bit parallel mode, then seven first selection/sense amplifier circuits are arranged among eight memory cell arrays, a second selection/sense amplifier circuit is arranged on the outside of the each of the outermost memory cell array of the eight memory cell arrays, and a plurality of input and output switching circuit are arranged between the first and second selection/sense amplifier circuits and four data buses. Since two memory cell arrays each are made to correspond sequentially in the order of arrangement to the respective members of the four data buses, the first and the second memory cell arrays from the left correspond to the first data bus, the third and the fourth memory cell arrays correspond to the second data bus, the fifth and the sixth memory cell arrays correspond to the third data bus, and the seventh and the eighth memory cell arrays correspond to the fourth data bus. Further, if the first and the second selection/sense amplifier circuits are designated from the left as the first, the second, . . . , and the ninth sense amplifiers, the data transmission between the first and the second memory cell arrays and the first data bus is executed via the first, second, and the third selection/sense amplifier circuits, the data transmission between the third and the fourth memory cell arrays and the second data bus is executed via the third, the fourth, and the fifth selection/sense amplifier circuits, and similarly, the data transmission between the fifth and the sixth memory cell arrays and the third data bus is executed via the fifth, the sixth, and the seventh selection/sense amplifier circuits, and the data transmission between the seventh and the eighth memory cell arrays and the fourth data bus is executed via the seventh, the eighth and the ninth selection/sense amplifier circuits.

As in the above, in this semiconductor memory circuit, the third, the fifth, and the seventh selection/sense amplifier circuits have to carry out the data transfer between the respective two data buses. For this reason, it becomes necessary to have two input and output switching circuits between these selection/sense amplifier circuits and the data buses, and the layout becomes complicated and the chip area needs be increased accordingly.

BRIEF SUMMARY OF THE INVENTION OBJECT OF THE INVENTION

It is therefore the object of this invention to provide a semiconductor memory circuit which enables one to simplify the layout and reduce the chip area.

SUMMARY OF THE INVENTION

The semiconductor memory circuit according to this invention comprises a plurality of memory cell arrays each including a plurality of memory cell trains, arranged adjacent with each other in a predetermined direction, a plurality of first selection/sense amplifier circuits arranged in every region between mutually adjacent pair of memory cell arrays, which amplify read data from memory cell trains alternately designated in the order of arrangement out of odd-numbered and even-numbered trains on one selected side of memory cell arrays on both sides of the region between the cell arrays, transmit one of the data to corresponding data input and output lines and supply write data transmitted to the corresponding input and output lines to selected memory cell train of selected memory cell array, two units of second selection/sense amplifier circuits arranged on the outside of the respective memory cell arrays on both ends of the plurality of memory cell arrays, which amplify read data from predetermined one memory cell train of odd-numbered and even-numbered trains of the outermost memory cell arrays and transmit one of the data to the corresponding data input and output lines and supply write data transmitted to the corresponding input and output lines to a selected memory cell train of the outermost memory cell array, a plurality of data buses corresponding to the respective bits of data transferred in bit parallel mode between the external circuit, and a plurality of input and output switching circuits arranged and connected respectively in one-to-one correspondence to the first and the second selection/sense amplifier circuits and connected to the plurality of the data buses so as to have equal number of memory cell trains that can carry out data transfer with the respective data buses, and carry out data transfer between these data buses and the first and the second selection/sense amplifier circuits in one-to-one correspondence mode.

In this semiconductor memory circuit, the input and output switching circuits are arranged in one-to-one correspondence to the first and the second selection/sense amplifier circuits, so that it is possible to simplify the layout and to decrease the chip area in proportion to the reduction in the number of input and output switching circuits.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
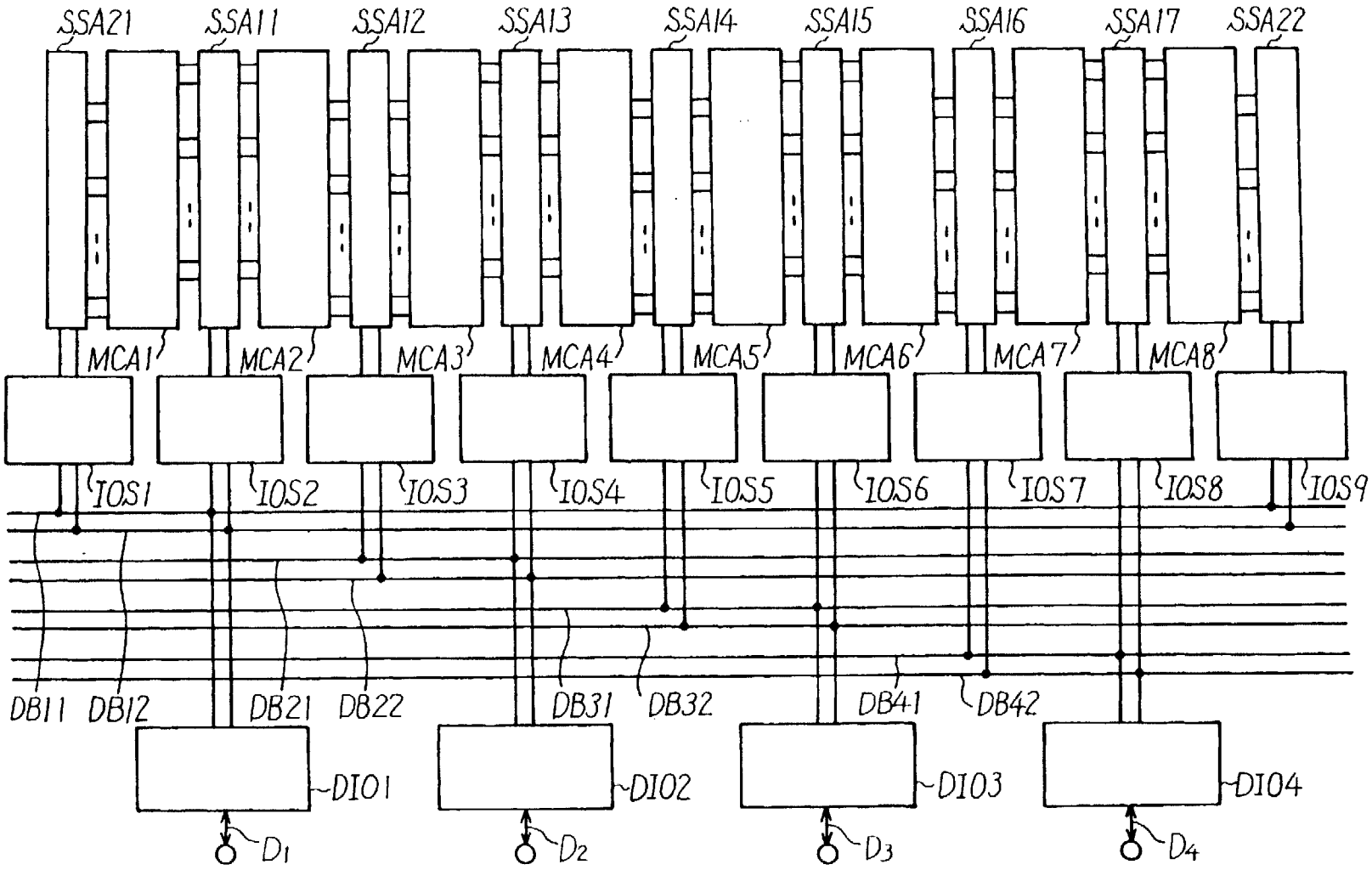
FIG. 1 is a block diagram for an embodiment of the invention.

Referring to FIG. 1, the semiconductor memory circuit which is an embodiment of the invention shown in this figure comprises a plurality of memory cell arrays MCA1 to MCA8 each including a plurality of memory cell trains, arranged in the direction of extension of these memory cell trains while keeping the correspondence relation among these memory cell trains, a plurality of first selection/sense amplifier circuits SSA11 to SSA17, each circuit including, first selection means arranged in the region between the cell arrays, namely, between memory cell arrays MCA1 and MCA2, between MCA2 and MCA3, between MCA3 and MCA4, . . . , and between MCA7 and MCA8, respectively, and selects out of the memory cell trains of the memory cell arrays on both sides of every region between the cell arrays either an odd-numbered train or an even-numbered train designated alternately in the order of arrangement, one side at a time, a plurality of sense amplifiers which amplify read data of memory cell trains selected by the first selection means in one-to-one correspondence, and second selection means which selects one of the sense amplifiers and one of the memory cell trains selected by the first selection means and connects them to corresponding data input and output lines, and transmits one of amplified read data of an odd-numbered or an even-numbered memory cell train of memory cell array on one side (MCA1, for example) to the corresponding data input and output lines, and supply write transmitted to the corresponding data input and output lines to a selected memory cell train of a selected memory cell array (MCA1, for example), second selection/sense amplifier circuits SSA21 and SSA22 which include a plurality of sense amplifiers, different from the selection/sense amplifier circuits SSA11 and SSA17, arranged in cell end regions outside of the memory cell arrays MCA1 and MCA8 and respectively amplify in one-to-one correspondence the read data of memory cell arrays and selection means which selects one of these sense amplifiers and one of designated odd-numbered or even-numbered memory cell trains and connect them to corresponding data input and output lines, and transmit amplified read data from designated odd-numbered or even-numbered memory cell train of the memory cell arrays MCA1 and MCA8 to corresponding data input and output lines and supply write data transmitted to the corresponding data input and output lines to selected memory cell trains of memory cell arrays MCA1 and MCA8, a plurality of data buses DB11/DB12 to DB41/DB42 which correspond to data $D_1$ to $D_4$, respectively, that are transferred in bit parallel manner between an external circuit, a plurality of input and output switching circuits IOS1 to IOS9 which are arranged in one-to-one correspondence to the first and the second selection/sense amplifier circuits SSA11 to SSA17/SSA21 and SSA22 and carry out one-to-one transfer of read data and write data between each of the data buses DB11/DB12 to DB41/DB42 and one of the corresponding selection/sense amplifier circuits by connecting the first input and output terminals to the data input and output lines of the corresponding selection/sense amplifier circuits and the second input and output terminals to one of the data buses DB11/DB12 to DB41/DB42 so as to have the number of memory cell trains capable of carrying out data transfer with the data buses is mutually equal, and data input and output circuits DIO1 to DIO4 which output read data transmitted to the data buses DB11/DB12 to DB41/DB42 to the external circuit in bit parallel manner and transmit write data from the external circuit to the data buses DB11/DB12 to DB41/DB42 in bit parallel manner.

Figure 2:
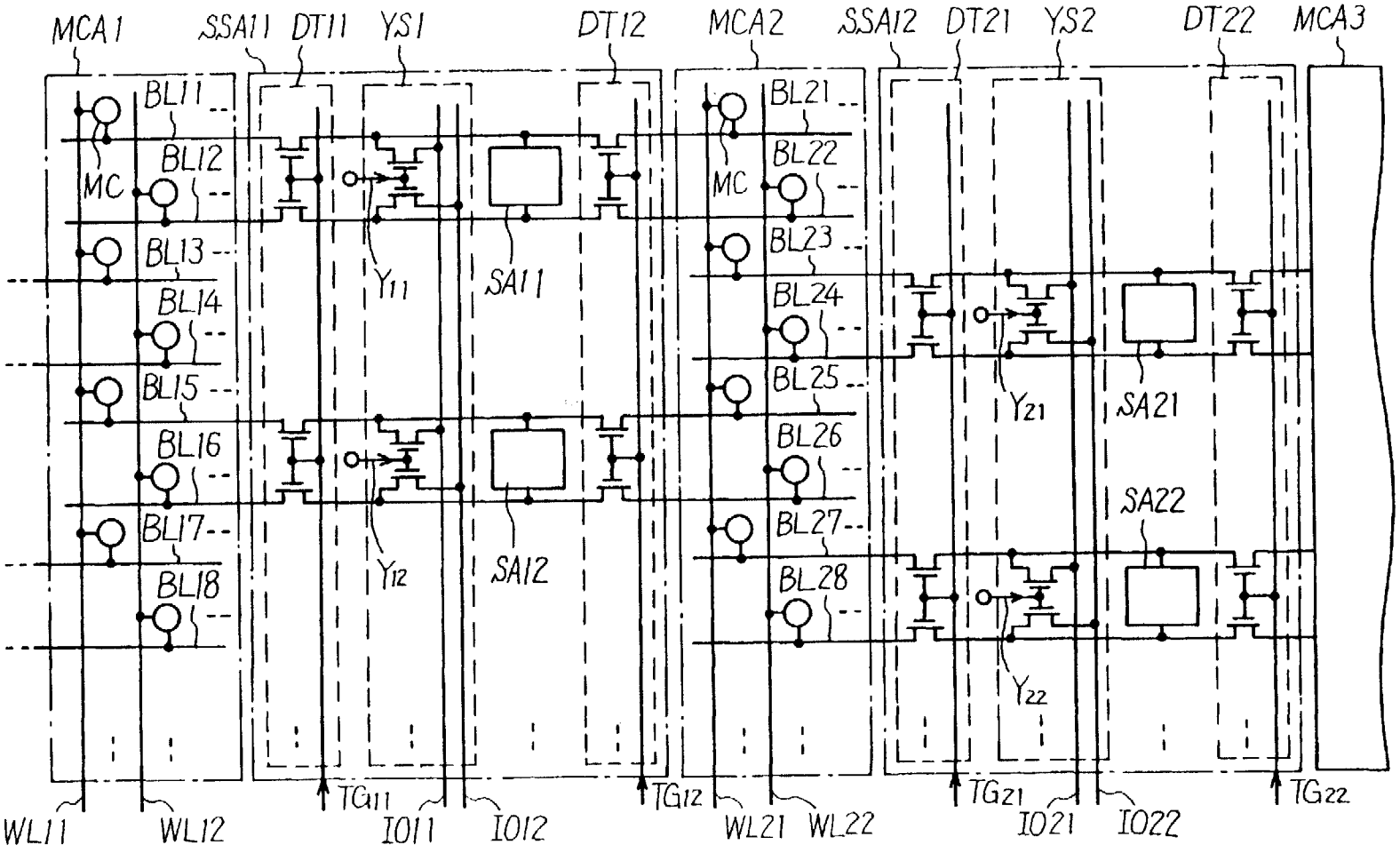
FIG. 2 is a circuit diagram for the memory call arrays and first selection/sense amplifier circuits which constitute a part of the embodiment.

Referring to FIG. 2 showing a part of the embodiment in terms of a specific circuit diagram, it can be seen that this embodiment has the folded bit line structure in which a bit line (BL12, for example) that gives a reference potential to the sense amplifier (SA11, for example) and a bit line for data read (BL11, for example) are arranged mutually parallel on one side of a sense amplifier (SA11).

An odd-numbered or an even-numbered memory cell train of the memory cell array is formed by memory cells (MCs) that are connected to a pair of bit lines for reference potential and for data read. For example, in the memory cell array MCA1, the memory cell train corresponding to the bit line pair BL11/BL12 and BL15/BL16 forms an odd-numbered train, while the memory cell train corresponding to BL13/BL14 and BL17/BL18 forms an even-numbered train.

A first selection/sense amplifier circuit. (SSA11, for example) has sense amplifiers (SA11, SA12, . . . ) provided one each for the memory cell train corresponding to one (odd-numbered train in SSA11) of odd-numbered and even-numbered trains of memory cell arrays on its both sides (MCA1 and MCA2, for example), data transfer circuits (DT11 and DT12) of the first selection means which selects, one side at a time, an odd-numbered or an even-numbered memory cell train of the memory cell arrays (MCA1 and MCA2) on both sides in response to transfer control signals ($TG_{11}$ and $TG_{12}$) and connects it to the corresponding sense amplifier circuit, and a train selection circuit (YS1) of the second selection means which connects one of odd-numbered or even-numbered memory cell train of the memory cell array selected by the data transfer circuits (DT11 and DT12) and one of the sense amplifier circuits selected in response to train selection signals ($Y_{11}$, $Y_{12}$,) to data input and output lines (IO11 and IO12).

Further, since the second selection/sense amplifier circuits SSA21 and SSA22 merely makes access to only one of odd-numbered and even-numbered trains of the memory cell trains of the memory arrays MCA1 and MCA2, each of them has one data transfer circuit (not shown in FIG. 2). The remaining construction is identical to the first selection/sense amplifier circuit. The access memory cell trains of the second selection/sense amplifier circuits SSA21 and SSA22 are even-numbered trains since the access memory cell trains of the adjacent first selection/sense amplifier circuits SSA11 and SSA17 are odd-numbered trains.

As described in the above, the access memory cell trains of the first and the second selection/sense amplifier circuits SSA11 to SSA17/SSA21 and SSA22 are so fixed as to be alternately odd-numbered and an even-numbered train according to the order of their arrangement, there is obtained a semiconductor memory circuit of the shared sense amplifier mode.

In this embodiment the memory cell trains that can transfer data between the data buses DB11/DB12 via the selection/sense amplifier circuits SSA11 to SSA17/SSA21 and SSA22 and the input and output switching circuits IOS1 to IOS9 are both the odd-numbered and even-numbered trains of the memory cell array MCA1, odd-numbered trains of the memory cell array MCA2, and even-numbered trains of the memory cell array MCA8, and the memory cell trains can transfer data between the data buses DB21/DB22 are even-numbered trains of the memory cell array MCA2, both the odd-numbered and even-numbered trains of the memory cell array MCA3, and odd-numbered trains of the memory cell array MCA4. Similarly, for the data buses DB31/DB32, they are even-numbered trains of MCA4, both the odd-numbered and even-numbered trains of MCA5, and odd-numbered trains of MCA6, and for the data buses DB41/DB42, they are even-numbered trains of MCA6, both the odd-numbered and even-numbered trains of MCA7, and odd-numbered trains of MCA8. One each of the memory cell trains that can carry out data transfer between each of the data buses DB11/DB12 to DB41/DB42 is selected by the selection/sense amplifier circuits SSA11 to SSA17/SSA21 and SSA22, and read for an external circuit of four-bit data $D_1$ to $D_4$ and write from the external circuit is carried out in bit parallel via the data input and output circuits DIO1 to DIO4.

In the conventional semiconductor memory circuit, the memory cell arrays that can transfer data between the data bus DB11/DB12 are MCA1 and MCA2, and similarly, for the data bus DB21/DB22 they are MCA3 and MCA4, for the data bus DB31/DB32 they are MCA5 and MCA6, and for the data bus DB41/DB42 they are MCA7 and MCA8. Accordingly, the selection/sense amplifier circuit SSA12 situated between the memory cell arrays MCA1 and MCA3 needs to perform data transfer with the two data buses DB11/DB12 and DB21/DB22, the selection/sense amplifier circuit SSA14 between the memory cell arrays MCA4 and MCA5 needs to perform data transfer with the two data buses DB21/DB22 and DB31/DB32, and the selection/sense amplifier circuit SSA16 between the memory cell arrays MCA6 and MCA7 needs to perform data transfer with the two data buses DB31/DB32 and DB41/DB42. Therefore, input and output circuits of two each are required between the selection/sense amplifier circuit SSA17, SSA14, SSA16 and the data buses DB11/DB12 to DB41/DB42, and it results in complication of the layout and increase of the chip area in proportion to this situation.

In contrast, this invention one data bus is assigned to each of the selection/sense amplifier circuits SSA11 to SSA17/SSA21 and SSA22, so that the input and output switching circuit between each of these selection/sense amplifier circuits SSA11 to SSA17/SSA21 and SSA22 and the data buses DB11/DB12 to DB41/DB42 becomes one for each, and accordingly it, is possible to simplify the layout and reduce the chip area.

Figure 3:
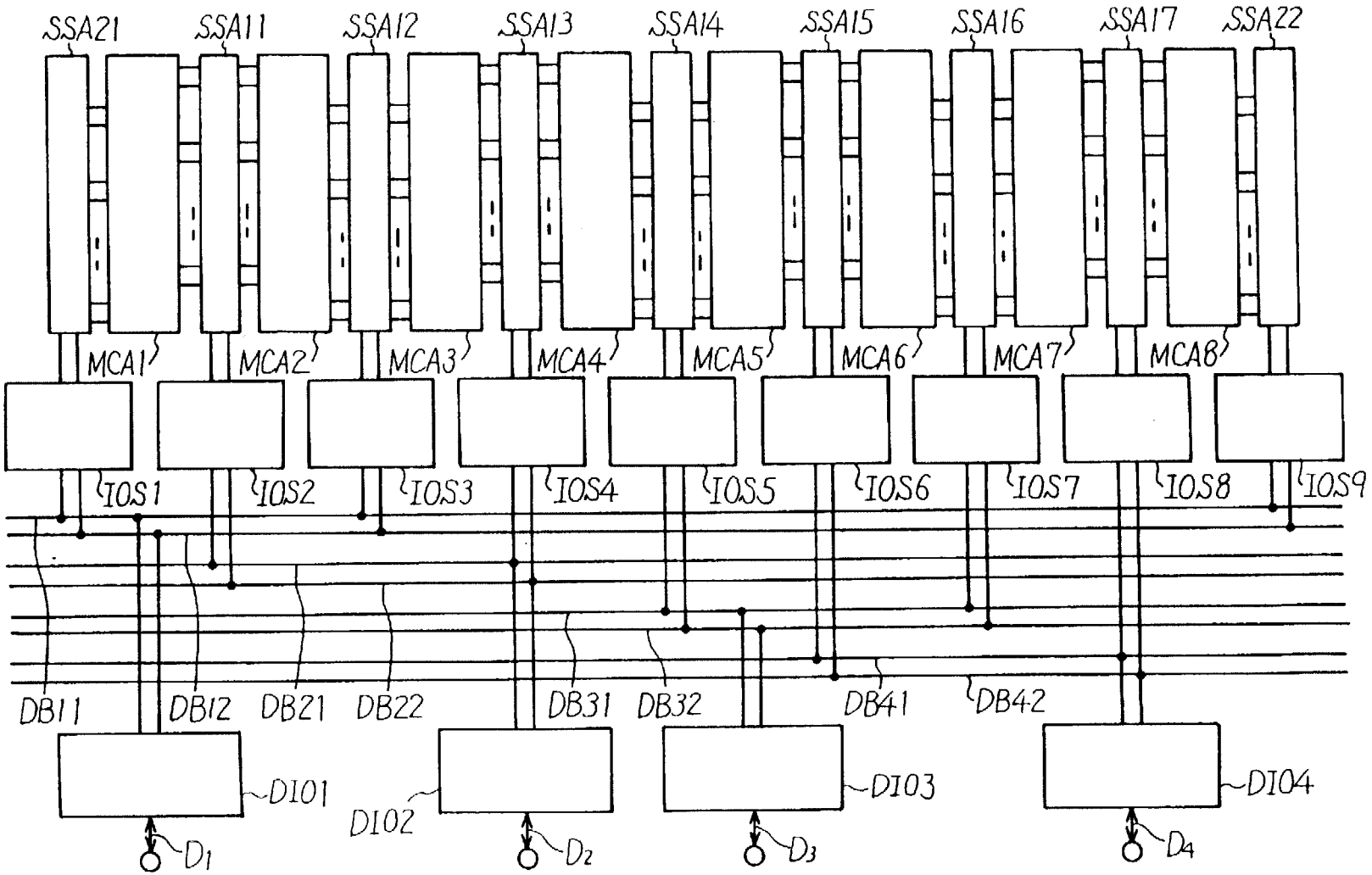
FIG. 3 is a block diagram for a modification of the embodiment.

Referring to FIG. 3 showing a modification of the embodiment, even-numbered trains (or odd-numbered trains) of the memory cell trains are made to correspond to odd-numbered data buses. The correspondence relation between the even-numbered train/odd-numbered train and the data buses can be anything provided that the number of the memory cell trains connectable to each data bus is equal.

Figure 4:
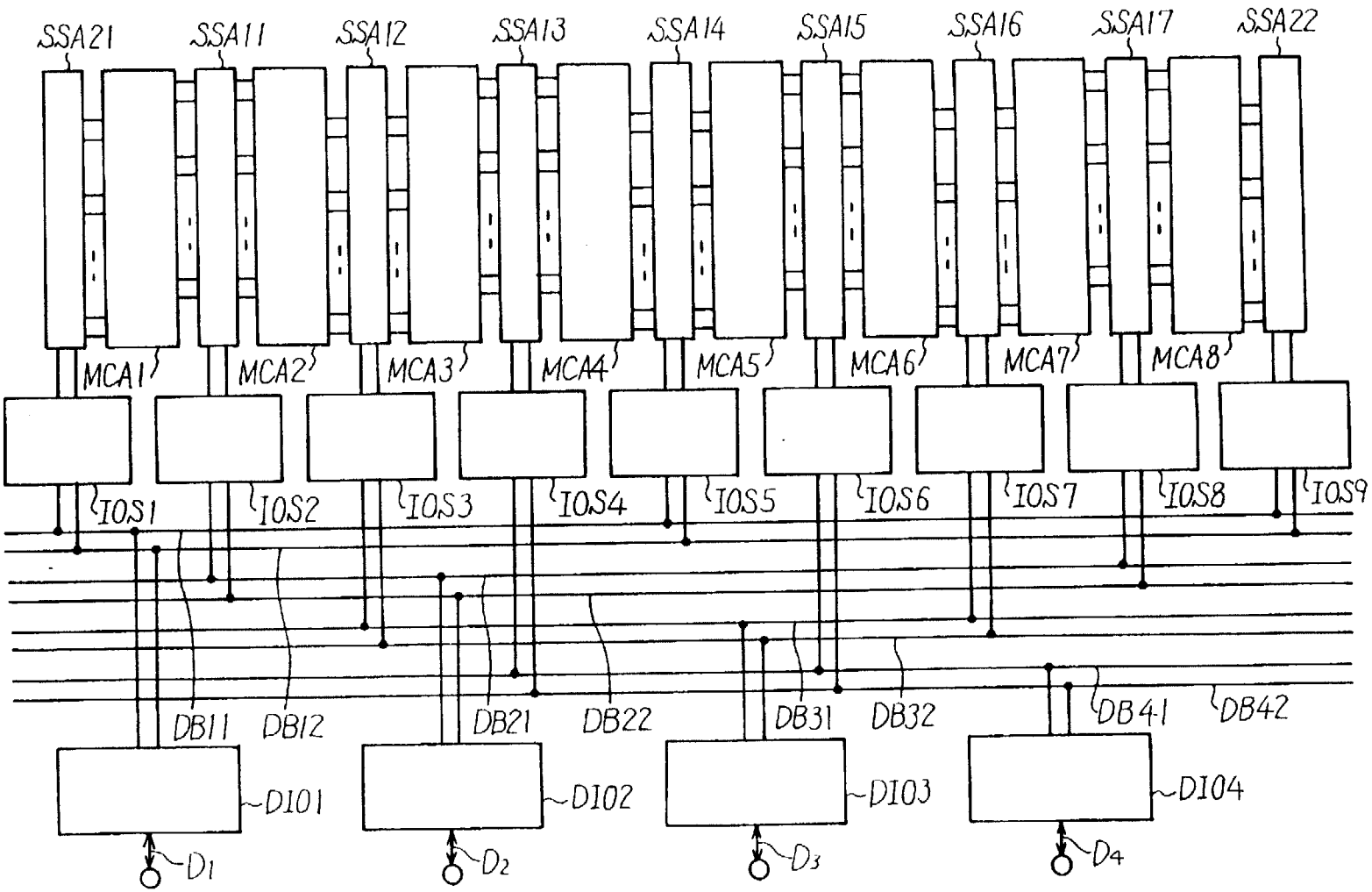
FIG. 4 is a block diagram for another modification of the embodiment.

Furthermore, the second selection/sense amplifier circuits SSA21 and SSA22 have memory cell trains of one of odd-numbered and even-numbered trains of the outermostly arranged memory cell arrays (MCA1 and MCA8) as the objects of access. Therefore, if the number of memory cell arrays connectable to one data bus is taken as the memory cell array unit (namely, the memory cell trains for an integral number of memory cell arrays), the second selection/sense amplifier circuits are connected without fail to the identical data bus via the corresponding input and output switching circuits. Accordingly, if the number of memory cells trains connectable to one data bus is set to be equal to an even number of times of the memory cell arrays, then the input and output switching circuit arranged at the center can also be made to be surely connected to the identical data bus for the outermost input and output switching circuits. Consequently, the pattern of the connection lines between the input and output switching circuits and the data buses can be made laterally symmetric with respect to the input and output switching circuit at the center, and the array design can further be facilitated. An example of the laterally symmetric pattern of the connection lines is shown in FIG. 4. There can be thought several patterns of laterally symmetric connection lines other than the one shown in FIG. 4, but a simple pattern with maximum regularity is advantageous.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that appended claims will cover any modifications or embodiments as fall within the true scope of the invention.

What is claimed is:

1. A semiconductor memory circuit comprising:

a plurality of memory cell arrays each consisting of a plurality of memory cell trains arranged in a direction in which these memory cell trains extend while keeping the mutual corresponding relationship among the memory cell trains;

a plurality of first selection/sense amplifier circuits including first selection means arranged in the respective regions between mutually adjacent pairs of said memory cell arrays for selecting one side at a time one of odd-numbered or even-numbered memory cell train out of the plurality of memory cell trains of the memory cell arrays on both sides of the regions between arrays, a plurality of amplifier means for amplifying in one-to-one correspondence the respective read data of memory cell trains selected by the first selection means, and second selection means for selecting one of the plurality of amplifier means and one of the memory cell trains selected by said first selection means and connecting them to corresponding data input and output lines, and transmit one of the amplified read data from a designated odd-numbered or even-numbered memory cell train of memory cell arrays on the selected one side to the corresponding data input and output lines and supply write data transmitted to the corresponding data input and output lines to selected memory cell trains of selected memory cell arrays; two units of second selection/sense amplifier circuits including a plurality of amplifier means arranged on the outside of the memory cell arrays on both ends of the arrangement of said plurality of memory cell arrays for amplifying in one-to-one correspondence the respective read data of odd-numbered or even-numbered memory cell trains of said memory cell arrays on both ends defined differently from the first selection/sense amplifier circuits corresponding to said memory cell arrays on both ends and connection means for selecting one of the plurality of the amplifier means and one of the designated odd-numbered or even-numbered memory cell array of said memory cell arrays on both ends and connecting them to corresponding data input and output lines, which transmit one of the amplified read data from the designated odd-numbered or even-numbered memory cell trains of the memory cell arrays on said both ends to said corresponding data input and output lines and supply write data transmitted to the corresponding data input and output lines from the external circuit to selected memory cell trains of said memory cell arrays on both ends; a plurality of data buses corresponding to each of the respective bits of data transferred in bit parallel mode between the external circuit; and a plurality of input and output switching circuits arranged in one-to-one correspondence to said plurality of first and second selection/sense amplifier circuits with their first input and output terminals connected to the data input and output lines of the corresponding selection/sense amplifier circuits and their second input and output terminals connected to one of said plurality of data buses so as to make the number of memory cell trains which makes the data transfer to the respective data buses, to carry out data transfer between each of said data buses and one of the corresponding selection/sense amplifier circuit;

wherein the number of memory cell trains capable of transferring data to the respective members of said plurality of data buses is set to be an even multiple of the number of said memory cell arrays, the second input and output terminals of the input and output switching circuits corresponding to said second selection/sense amplifier circuits and the input and output switching circuit corresponding to the first selection/sense amplifier circuit arranged at the center of the first selection/sense amplifier circuits are connected to an identical data bus of the plurality of said data buses, and the second input and output terminals of the input and output switching circuits other than these input and output switching circuits are connected to the corresponding data buses so as to be laterally symmetric with respect to the connection line to the data bus of the input and output switching circuit corresponding to said first selection/sense amplifier circuit arranged at the center as the center line of symmetry.

2. A semiconductor memory device comprising:

a plurality of memory cell blocks each including a first and a second group of memory cells, said memory cell blocks being arranged in a first direction;

a first amplifier block provided adjacently to one end of an arrangement of said memory cell blocks, coupled to one of said first and second groups in one of said memory cell blocks on said one end, and selectively transferring a data of one of said memory cells in said one of said first and second groups via a first internal data line extending in a second direction different from said first direction;

a second amplifier block provided adjacently to another end of said arrangement, coupled to one of said first and second groups in one of said memory cell blocks on said another end, and selectively transferring a data of one of said memory cells in said one of first and second groups via a second internal data line thereof extending in said second direction;

at least one third amplifier block arranged between said memory cell blocks, coupled to one of said first and second groups in one of said memory cell blocks adjacent to one side thereof, and to one of said first and second groups in one of said memory cell blocks adjacent to another side thereof, and selectively transferring a data of one of said groups coupled thereto via a third internal data line thereof extending along said second direction;

a first data line extending along said first direction and coupled commonly to said first and second internal data lines in said first and second amplifier blocks while being isolated from said third internal data line in said third amplifier block, said first and second amplifier blocks thereby being coupled to a common first input-output circuit via said first data line independently from said third amplifier block;

a second data line extending along said first direction and coupled to said third internal data [lines] *line* in said third amplifier block and thereby coupling said third amplifier block to a second input-output circuit independently from said first and second amplifier blocks.

3. A semiconductor memory device comprising:

a plurality of memory cell blocks each including a first and a second memory cell;

a plurality of amplifier blocks, said memory cell blocks and said amplifier blocks being arranged alternately to form an array extending along a first direction, said array having on both ends thereof said amplifier blocks, thereby each of said memory cell blocks having both sides thereof on said first direction facing to said amplifier blocks, each of said memory cell blocks having said first and second memory cells thereof coupled to said amplifier blocks on one and another sides thereof, respectively;

a first data line for selectively connecting said amplifier blocks on said both ends of said array commonly to a first input-output circuit, thereby said first input-output circuit being associated with a first number of said first and second memory cells for read or write operation of said memory device;

a second data line for selectively connecting at least one of said amplifier blocks other than said amplifier blocks coupled to said first input-output circuit to a second input-output circuit, thereby said second input-output circuit being associate with said first number of said first and second memory cells for said operation of said memory devices.

*4. A semiconductor memory device comprising:*

*a plurality of memory cell blocks each including a first and a second group of memory cells, said memory cell blocks being arranged in a first direction;*

*a first amplifier block provided adjacently to one end of an arrangement of said memory cell blocks, coupled to one of said first and second groups in one of said memory cell blocks on said one end, and selectively transferring a data of one of said memory cells in said one of said first and second groups via a first internal data line extending in a second direction different from said first direction;*

*a second amplifier block provided adjacently to another end of said arrangement, coupled to one of said first and second groups in one of said memory cell blocks on said another end, and selectively transferring a data of one of said memory cells in said one of first and second groups via a second internal data line thereof extending in said second direction;*

*at least one third amplifier block arranged between said memory cell blocks, coupled to one of said first and second groups in one of said memory cell blocks adjacent to one side thereof, and to one of said first and second groups in one of said memory cell blocks adjacent to another side thereof, and selectively transferring a data of one of said groups coupled thereto via a third internal data line thereof extending along said second direction;*

*a first data line extending along said first direction and coupled commonly to said first and second internal data lines in said first and second amplifier blocks while being isolated from said third internal data line in said third amplifier block; and*

*a second data line extending along said first direction and coupled to said third internal data line in said third amplifier block.*

*5. A semiconductor memory device as claimed in claim 4, further comprising a first interface circuit coupled to said first data line and a second interface circuit coupled to said second data line, said first and second amplifier blocks thereby being coupled to first interface circuit in common via said first data line independently from said third amplifier block, and said third amplifier block thereby being coupled to said second interface circuit independently from said first and second amplifier blocks.*

*6. A semiconductor memory device as claimed in claim 5, wherein:*

*said first interface circuit operatively receives read data from one of said first and second amplifier blocks; and*

*said second interface circuit operatively receives read data from said third amplifier block.*

*7. A semiconductor memory device as claimed in claim 6, wherein said first and second interface circuits operatively transfer write data to be written in said memory device.*

*8. A semiconductor memory device as claimed in claim 4, wherein:*

*each of said memory cell blocks has the memory cells thereof arranged in rows and numbered columns to form a matrix, said columns including even and odd numbered columns;*

*each of said columns extends in said first direction;*

*for each of said memory cell blocks, said even numbered columns comprise one of said first and second groups of memory cells, and said odd numbered columns include the other of said first and second groups of memory cells.*

*9. A semiconductor memory device as claimed in claim 8, further comprising:*

*a plurality of sense amplifiers in each of said first, second and third amplifier blocks, each of said sense amplifiers having a pair of input nodes; and*

*a plurality of pairs of parallel bit lines extending in said columns, one and another of bit lines in one of said pairs of bit lines providing a reference potential and a read signal to be applied to said sense amplifier, said sense amplifier in said third amplifier block having said pair of input nodes thereof operatively connected to either one of said pairs of bit lines in one of said memory cell blocks facing to one side of said third*

*amplifier block and another pair of bit lines in another memory cell block facing to another side of said third amplifier block.*

*10. A semiconductor memory device as claimed in claim 9, further comprising:*

*a plurality of first pairs of transfer gate transistors each arranged between one of said pairs of bit lines and associated one of said sense amplifiers operatively providing a current path between one of said bit lines in said pair of bit lines and one of said nodes of said sense amplifier and simultaneously providing another current path between another of said bit lines in said pair of bit lines and another of said nodes of said sense amplifier in response to a transfer control signal.*

*11. A semiconductor memory device as claimed in claim 10, further comprising a plurality of second pairs of transfer gate transistors each associated with one of said sense amplifiers in said first, said second and said third amplifier blocks, each of said pairs of second transfer gate transistors selectively providing a first current path between one of said nodes of said sense amplifier and one of said first, said second and said third internal data line and a second current path between another of said nodes of said sense amplifier and a complement data line associated with said one of said first, said second and said third internal data lines.*

*12. A semiconductor memory device comprising:*

*a plurality of memory cell blocks each including a first and a second memory cell;*

*a plurality of amplifier blocks, said memory cell blocks and said amplifier blocks being arranged alternately to form an array extending along a first direction, said array having on both ends thereof said amplifier blocks, thereby each of said memory cell blocks having both sides thereof on said first direction facing to said amplifier blocks, each of said memory cell blocks having said first and second memory cells thereof coupled to said amplifier blocks on one and another sides thereof, respectively;*

*a first data line coupled to said amplifier blocks on said both ends of said array commonly and associated with a number of said first and second memory cells for read or write operation of said memory device; and*

*a second data line coupled to at least one of said amplifier blocks other than said amplifier blocks coupled to said first data line, said second data line being isolated from said first data line and associated with said number of said first and second memory cells for said operation of said memory device.*

*13. A semiconductor memory device as claimed in claim 12, further comprising a first data transfer circuit coupled to said first data line and selectively coupled to said amplifier blocks on said both ends of said array via said first data line, said first data transfer circuit being associated with said number of memory cells, and a second data transfer circuit coupled to said second data line and selectively coupled to said at least one amplifier block via said second data line, said second data transfer circuit being associated with said number of memory cells.*

*14. A semiconductor memory device as claimed in claim 13, wherein said first and second data transfer circuits receive read data of the memory device via said first and second data lines.*

*15. A semiconductor memory device as claimed in claim 12, wherein each of said memory cell blocks includes said memory cells arranged in rows and columns, said columns extending in said first direction, one of said first and second memory cells belonging to an even numbered column, another of said first and second memory cells belonging to an odd numbered column.*

*16. A semiconductor memory device as claimed in claim 15, further comprising:*

*a sense amplifier in each of said amplifier blocks, said sense amplifier having a pair of input nodes; and*

*a pair of bit lines in each of said columns, said pair of bit lines being arranged in a folded bit line structure having one and another of said bit lines in said pair of bit lines providing a reference potential and a read signal to be applied to said sense amplifier, said sense amplifier in one of said amplifier blocks arranged between two of said memory cell blocks having said pair of input nodes thereof operatively connected to one pair of bit lines in one column in either one of said two memory cell blocks.*

*17. A semiconductor memory device as claimed in claim 16, further comprising:*

*a first pair of transfer gate transistors selectively providing current paths between said pair of input nodes of said sense amplifier in one of said amplifier blocks arranged between two of said memory cell blocks and one pair of bit lines in one column in either one of said two memory cell blocks in response to a first transfer control signal; and a second pair of transfer gate transistors selectively providing current paths between said pair of input nodes of said sense amplifier and another pair of bit lines in another column in another of said two memory cell blocks in response to a second transfer control signal.*

*18. A semiconductor memory device as claimed in claim 17, further comprising:*

*a pair of signal lines extending in each of said amplifier blocks and in a second direction perpendicular to said first direction; and*

*a selection circuit in each of said amplifier blocks providing current paths between said input nodes of selected one of said amplifiers and said pair of signal lines according to a selection signal, said pair of signal lines being coupled to one of said data lines via a switching circuit.*

*19. A combination of amplifier blocks and memory cell blocks comprising:*

*N amplifier blocks arranged in a first direction, said N amplifier blocks including a first amplifier block, a last amplifier block, and a remainder of amplifier blocks;*

*N-1 memory cell blocks, each arranged between and coupled with two respectively adjacent ones of said N amplifier blocks, said remainder of amplifier blocks each being shared by two respectively adjacent ones of said memory cell blocks;*

*a first data line coupled to said first amplifier block-and said last amplifier block; and*

*a second data line coupled to one of said remainder of amplifier blocks, said second data line being isolated from said first amplifier block and said last amplifier block.*

*20. A combination as claimed in claim 19, further comprising:*

*for each of said amplifier blocks, a respective signal line, extending in a second direction perpendicular to said first direction, for transferring a data signal from an associated one of said memory cell blocks;*

*said first data line being coupled, at a first side thereof, to said respective signal line of said first amplifier block;*

*said first data line being coupled, at a second side thereof, to said respective signal line of said last amplifier block.*

* * * * *

US00RE36203F1

(12) EX PARTE REEXAMINATION CERTIFICATE (6998th)

United States Patent

Matsui

(10) Number: US RE36,203 F1

(45) Certificate Issued: Aug. 18, 2009

(54) SEMICONDUCTOR MEMORY CIRCUIT

(75) Inventor: Yoshinori Matsui, Tokyo (JP)

(73) Assignee: NEC Electronics Corporation, Nakahara-Ku, Kawasaki, Kanagawa (JP)

Reexamination Request:
No. 90/008,962, Dec. 17, 2007

Reexamination Certificate for:

| | |
|---|---|
| Patent No.: | **Re. 36,203** |
| Issued: | **Apr. 27, 1999** |
| Appl. No.: | **08/916,280** |
| Filed: | **Aug. 22, 1997** |

Related U.S. Patent Documents

Reissue of:

| | |
|---|---|
| (64) Patent No.: | **5,444,305** |
| Issued: | **Aug. 22, 1995** |
| Appl. No.: | **08/084,017** |
| Filed: | **Jun. 30, 1993** |

(30) Foreign Application Priority Data

Jun. 30, 1992 (JP) ..... 4-172229

(51) Int. Cl.

| | |
|---|---|
| ***G11C 11/4096*** | (2006.01) |
| ***G11C 7/10*** | (2006.01) |
| ***G11C 11/409*** | (2006.01) |

(52) U.S. Cl. ..... 365/207; 365/230.03; 365/230.04; 365/63

(58) Field of Classification Search ..... None
See application file for complete search history.

(56) References Cited

U.S. PATENT DOCUMENTS 5,297,086 A 3/1994 Nasu et al.

FOREIGN PATENT DOCUMENTS

| | | |
|---|---|---|
| EP | 0 068 645 | 1/1983 |
| EP | 0 401 792 | 12/1990 |
| JP | 05-234377 | 9/1993 |

OTHER PUBLICATIONS

European Search Report, Mar. 31, 1994 for corresponding EP Application No. 93 11 0460.

*Primary Examiner*—Zoila E Cabrera

(57) ABSTRACT

This semiconductor circuit includes a plurality of memory cell arrays arranged mutually adjacent in one direction, a plurality of first selection/sense amplifier circuits provided in the respective regions between mutually adjacent pairs of these memory cell arrays and make access to one of alternately defined odd-numbered or even-numbered memory cell trains in the order of arrangement, two units of second selection/sense amplifier circuits arranged on the outside of the memory cell arrays on both ends of the arrangement of the plurality of memory cell arrays and make access to one of the designated odd-numbered or even-numbered memory cell trains of the memory cell arrays on both ends, a plurality of data buses corresponding to the respective bits of data transferred in bit parallel between an external circuit, and a plurality of input and output switching circuits arranged and connected in one-to-one correspondence to the respective first and second selection/sense amplifier circuits connected to the plurality of data buses so as to have an equal number of memory cell trains capable of transferring data with these data buses, and a plurality of input and output switching circuits which transfer data with the first and the second selection/sense amplifier circuits in one-to-one correspondence.

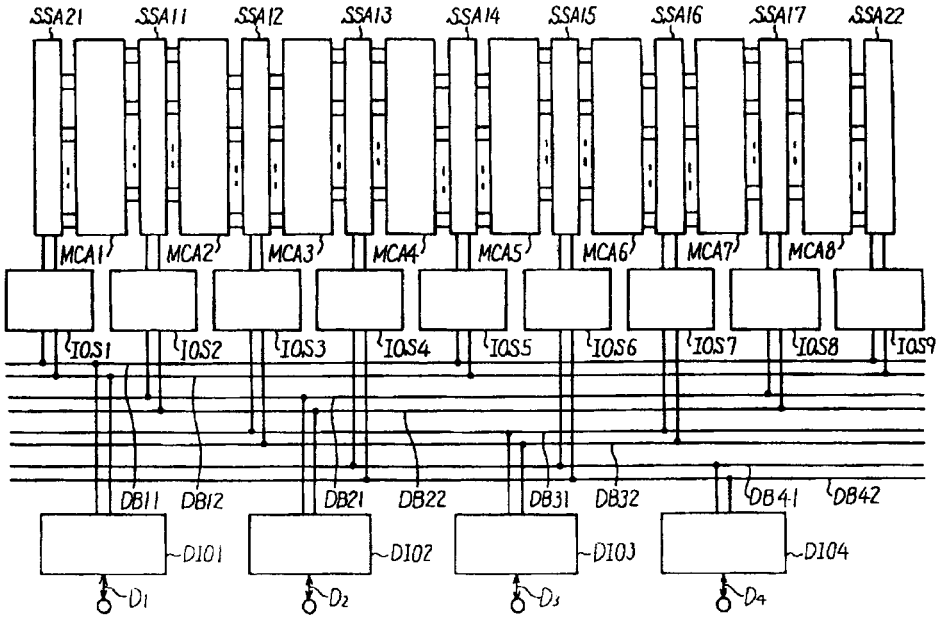

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the the original patent but was deleted by the reissue patent; matter printed in italics was added by the reissue patent. Matter enclosed in heavy double brackets [[ ]] appeared in the reissue patent but is deleted by this reexamination certificate; matter printed in boldface is added by this reexamination certificate.

AS A RESULT OF REEXAMINATION, IT HAS BEEN DETERMINED THAT:

Claims 2–3 are cancelled.

Claims 4–5, 12–13 and 19–20 are determined to be patentable as amended.

Claims 6–8 and 14–18, dependent on an amended claim, are determined to be patentable.

Claims 1 and 9–11 were not reexamined.

*4. A semiconductor memory device comprising:*

*a plurality of memory cell blocks each including a first and a second group of memory cells, said memory cell blocks being arranged in a first direction:*

*a first amplifier block provided adjacently to one end of an arrangement of said memory cell blocks, coupled to one of said first and second groups in one of said memory cell blocks on said one end, and selectively transferring a data of one of said memory cells in said one of said first and second groups via a first internal data line extending in a second direction different from said first direction;*

*a second amplifier block provided adjacently to another end of said arrangement, coupled to one of said first and second groups in one of said memory cell blocks on said another end, and selectively transferring a data of one of said memory cells in said one of first and second groups via a second internal data line thereof extending in said second direction;*

[[*at least one*]] a plurality of *third amplifiers* [[*block*]] blocks *arranged between said memory cell blocks, coupled to one of said first and second groups in one of said memory cell blocks adjacent to one side thereof, and to one of said first and second groups in one of said memory cell blocks adjacent to another side thereof, and selectively transferring a data of one of said groups coupled thereto via a third internal data line thereof extending along said second direction*, said plurality of third amplifier blocks comprising a center third amplifier block being arranged at the center of a line consisting of said plurality of third amplifier blocks and a remaining third amplifier blocks being said plurality of third amplifier blocks other than said center third amplifier block;

*a first data line extending along said first direction and coupled commonly to said first and second internal data lines in said first and second amplifier blocks* and said third internal data line in said center third amplifier block while being isolated from said third internal data [[*line*]] lines *in said* remaining *third aplifier* [[*block*]] blocks; *and*

*a second data line extending along said first direction and coupled to said third internal data* [[*line*]] lines *in said* remaining *third amplifier* [[*block*]] blocks.

*5. A semiconductor memory device as claimed in claim 4, further comprising a first interface circuit coupled to said first data line and a second interface circuit coupled to said second data line, said first and second amplifier blocks* and the center third amplifier block *thereby being coupled to first interface circuit in common via said first data line independently from said* remaining *third amplifier* [[*block*]] blocks, *and said* remaining *third amplifier block thereby being coupled to said second interface circuit independently from said first and second amplifier blocks* and said center third amplifier block.

*12. A semiconductor memory device comprising:*

*a plurality of memory cell blocks each including a first and a second memory cell;*

*a plurality of amplifier blocks, said memory cell blocks and said amplifier blocks being arranged alternately to form an array extending along a first direction, said array having on both ends thereof said amplifier blocks* and at the center thereof a center amplifier block, *thereby each of said memory cell blocks having both sides thereof on said first direction facing to said amplifier blocks, each of said memory cell blocks having said first and second memory cells thereof coupled to said amplifier blocks on one and another sides thereof, respectively;*

*a first data line coupled to said amplifier blocks on said both ends of said array* and said center amplifier block at said center of said array *commonly and associated with a number of said first and second memory cells for read or write operation of said memory device; and*

*a second data line coupled to at least one of said amplifier blocks other than said amplifier blocks coupled to said first data line, said second data line being isolated from said first data line and associated with said number of said first and second memory cells for said operation of said memory device.*

*13. A semiconductor memory device as claimed in claim 12, further comprising a first data transfer circuit coupled to said first data line and selectively coupled to said amplifier blocks on said both ends of said array* and said center amplifier block at the center of said array *via said first data line, said first data transfer circuit being associated with said number of memory cells, and a second data transfer circuit coupled to said second data line and selectively coupled to said at least one amplifier block via said second data line, said second data transfer circuit being associated with said number of memory cells.*

*19. A combination of amplifier blocks and memory cell blocks comprising:*

*N amplifier blocks arranged in a first direction, said N amplifier blocks including a first amplifier block, a last amplifier block,* a center amplifier block *and a remainder of amplifier blocks;*

*N-1 memory cell blocks, each arranged between and coupled with two respectively adjacent ones of said N amplifier blocks*, said center amplifier block, *said remainder of amplifier blocks each being shared by two respectively adjacent ones of said memory cell blocks;*

*a first data line coupled to said first amplifier block*[[-]], said center amplifier block *and said last amplifier block; and*

*a second data line coupled to one of said remainder of amplifier blocks, said second data line being isolated from said first amplifier block*, said center amplifier block *and said last amplifier block.*

*20. A combination as claimed in claim 19, further comprising:*

*for each of said amplifier blocks, a respective signal line, extending in a second direction perpendicular to said first direction, for transferring a data signal from an associated one of said memory cell blocks;*

*said first data line being coupled, at a first side thereof to said respective signal line of said first amplifier block;* said first data line being coupled, at the center thereof to said respective signal line of said center amplifier block; and

*said first data line being coupled, at a second side thereof to said respective signal line of said last amplifier block.*

* * * * *